United States Patent [19]

Halvis

[11] Patent Number: 4,900,688
[45] Date of Patent: Feb. 13, 1990

[54] PSEUDO UNIPHASE CHARGE COUPLED DEVICE FABRICATION BY SELF-ALIGNED VIRTUAL BARRIER AND VIRTUAL GATE FORMATION

[75] Inventor: James Halvis, Arnold, Md.

[73] Assignee: The United States of America as represented by the Secretary of the Air Force, Washington, D.C.

[21] Appl. No.: 332,856

[22] Filed: Apr. 3, 1989

Related U.S. Application Data

[62] Division of Ser. No. 66,292, Jun. 25, 1987.

[51] Int. Cl.$^4$ .................. H01L 21/265; H01L 29/78; G11C 19/28
[52] U.S. Cl. ........................................ 437/29; 437/30; 437/41; 437/53
[58] Field of Search ........................ 437/29, 30, 41, 53; 357/24

[56] References Cited

U.S. PATENT DOCUMENTS

| | | | |
|---|---|---|---|
| 4,012,759 | 3/1977 | Esser | 357/24 |
| 4,228,445 | 10/1980 | Tasch, Jr. et al. | 357/24 |
| 4,229,752 | 10/1980 | Hynecek | 357/24 |
| 4,642,877 | 2/1987 | Garner et al. | 437/53 |
| 4,679,212 | 7/1987 | Hynecek | 357/24 |
| 4,725,872 | 2/1988 | Blouke et al. | 357/24 |
| 4,742,016 | 5/1988 | Rhodes | 437/37 |
| 4,746,622 | 5/1988 | Hawkins et al. | 437/26 |
| 4,774,199 | 9/1988 | Blanchard et al. | 437/29 |
| 4,806,498 | 2/1989 | Fujii | 437/24 |
| 4,814,844 | 3/1989 | Bluzer | 357/24 |

Primary Examiner—Olik Chaudhuri
Attorney, Agent, or Firm—Gerald B. Hollins; Donald J. Singer

[57] ABSTRACT

A pseudo uniphase CCD array having four functional regions, a clocked barrier region, a clocked well region, a virtual barrier region, and a gate variable potential well region per stage. The described structure allows flexibility in setting operating voltages and avoids the breakdown and fabrication difficulties of a virtual well region. The device employs a virtual barrier plus adjacent MOS well fixed potential region and uses clocking of barrier and well regions to achieve charge transfer. A fabrication sequence and operating potential selection criteria are also included.

19 Claims, 7 Drawing Sheets

PSEUDO UNIPHASE CHARGE COUPLED DEVICE FABRICATION BY SELF-ALIGNED VIRTUAL BARRIER AND VIRTUAL GATE FORMATION

RIGHTS OF THE GOVERNMENT

The invention described herein may be manufactured and used by or for the Government of the United States for all governmental purposes without the payment of any royalty.

This is a division of application Ser. No. 07/066,292 filed Jun. 25, 1987.

BACKGROUND OF THE INVENTION

This invention relates to the field of semiconductor charge transfer devices, their fabrication and operation. The invention particularly concerns a charge coupled device (CCD) wherein the combination of a single phase clock signal, a fixed potential control gate and substrate barrier regions achieve transfer control of signal charge.

CCD arrays are relatively difficult to manufacture in comparison with many integrated circuit devices. The narrow gate spacings and overlapping gate structures required in some CCD arrays of the two, three and four phase types are known, for example, to incur inter-level and intra-level shorting difficulties. Virtual phase CCDs however employ an implanted virtual gate between adjacent metal oxide semiconductor gate electrodes and thereby operate at a fixed voltage level determined by the buried channel implant in the gate region. Such CCDs largely eliminate the gate shorting phenomenon encountered with two, three, and four phase CCD arrays. In virtual phase CCDs, however, the implant regions which form the charge conducting buried channel are somewhat difficult to control in a manufacturing environment. The implanting energy levels, heat treating and other manufacturing steps required to achieve a predetermined doping level in an implanted semiconductor region are found to be precisely determined only with carefully developed and controlled processing steps. Such processing adds undesirably to the manufacturing complexity, yield difficulty, and overall cost of this type of CCD device.

The pseudo uniphase CCD as in the present invention, does not eliminate the need for overlapping gate and implanted substrate topologies, but does significantly reduce the number of these limiting arrangements needed in a particular CCD array. The herein disclosed pseudo uniphase CCD structure also seizes upon the advantages in fabrication simplicity and device performance characteristics which flow from the use of self-aligning elements in the CCD structurce. Self-aligning elements in the CCD structure both eliminate the need for close tolerance masking during the device manufacturing sequence and assure electrical locations and electrical performance which meets the expected characteristics of the CCD array.

SUMMARY OF THE INVENTION

In the present CCD cell two controlled electric potential gates and two charge channel disposed barrier regions together with a virtual barrier coincident virtual gate are employed. The invention contemplates fixed potential direct current operation of one gate electrode and pulsed operation of the other gate electrode with a transfer of charge carriers over barrier regions to potential controlled charge carrier wells. The CCD cell of the invention includes one overlapping gate structure and plural regions of impurity implant in the device substrate. The invention concerns the described cell structure, its fabrication and its use; and includes alternate structures and fabrications capable of both optical image to electrical signal transducing and electrical signal processing uses.

An object of the invention, therefore, is to provide a CCD cell arrangement which minimizes the use of overlapping gate structures.

Another object of the invention is to provide a CCD cell arrangement which minimizes the requirement for ion implant fabrication steps.

Another object of the invention is to provide a pseudo uniphase charge coupled device which can be arranged for response to optical input signals or electrical input signals.

Another object of the invention is to provide a desirable pseudo uniphase charge coupled device fabrication sequence.

Another object of the invention is to provide a pseudo uniphase charge coupled device which can be achieved commencing with either an epitaxial wafer substrate or a normal homogeneous wafer substrate.

Another object of the invention is to provide an improved operating arrangement for a pseudo uniphase charge coupled device.

Another object of the invention is to provide a pseudo uniphase charge coupled device which may be fabricated in a plurality of different device dimension arrangements.

Another object of the invention is to provide a pseudo uniphase charge coupled device arrangement wherein the criticality of ion implanting manufacturing steps is minimized.

Another object of the invention is to utilize the processing simplicity and operational performance enhancement which results from self-aligning ion implant fabrication steps.

Another object of the invention is to provide a pseudo uniphase charge coupled device in which the opportunity for inter-gate electrical breakdown phenomonon is minimized.

Another object of the invention is to provide a pseudo uniphase charge coupled device wherein the use of either polysilicon or metal gate electrode structures is possible.

Another object of the invention is to provide a pseudo uniphase charge coupled device in which complementary, opposed polarity, ion implantations decrease the criticality of the ion implantation.

Another object of the invention is to provide a pseudo uniphase charge coupled array wherein a desirable degree of flexibility in setting operating voltages is achieved by way of the absence of a virtual charge well region in the array.

Another object of the invention is to provide a pseudo uniphase charge coupled device in which the tendency toward avalanche breakdown as a result of high electric field intensities between a virtual gate and buried channel region is minimized.

Additional objects and features of the invention will be understood from the following description and the accompanying drawings.

These and other objects of the invention are achieved by a pseudo uniphase charge coupled device cell which includes the combination of a single crystalline semiconductor substrate member having a buried channel charge communicating doped layer disposed thereon, a gate dielectric layer disposed over the doped layer, a clock gate electrode element disposed over the gate dielectric layer adjacent the charge communication channel and the doped layer and at the input end of the cell, the clock gate electrode being overlaid by a layer of electrical insulation and being connected to an amplitude pulsed source of clock signals, a first ion implant barrier region located below the input edge of the clock gate electrode in the charge communicating channel, the barrier region being electrically isolated from the surrounding environment, a fixed potential gate electrode element disposed over the gate dielectric layer adjacent the charge coupled communication channel in the epitaxial layer and at the output end of the cell, the electrode being connected to a source of fixed electric potential and having at the cell output end thereof an electrode portion which overlays the electrically insulated clock gate electrode element of the next following cell, a second ion implant barrier region virtual gate located in the charge communicating channel intermediate the clock gate electrode and the fixed potential gate electrode with extension below the clock gate output edge and the fixed potential gate input edge.

DETAILED DESCRIPTION

Figure 1:
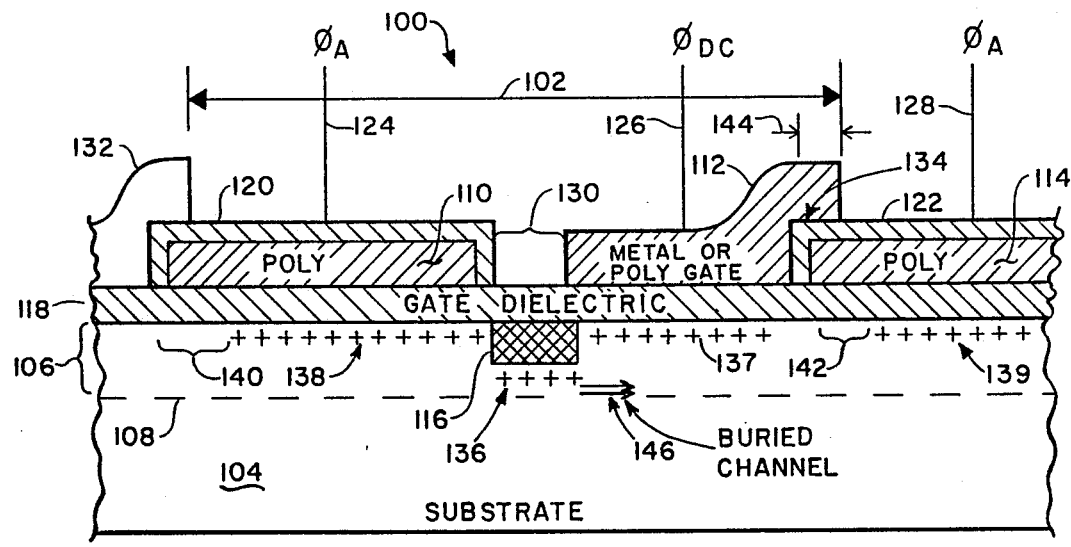
FIG. 1 shows one cell and parts of the adjacent cells in a pseudo uniphase CCD which is made in accordance with the invention.

FIG. 1 of the drawings shows a cross-sectional view of one cell and portions of the adjoining cells from a CCD array 100 that is made in accordance with the present invention. The dimension 102 defines the repeating cell structure in the FIG. 1 array. The FIG. 1 portion of a CCD array also includes the substrate member 104, and an epitaxial or gross ion implantation layer region 106 within the substrate 104 a region having an extent that is indicated by the line 108. Also shown in FIG. 1 is a clocked gate electrode 110, a fixed potential or dc gate electrode 112, and the clock gate electrode 114 of the next following cell in the array 100. The clocked gate electrodes 110 and 114 are covered by electrical insulating layers 120 and 122, and are insulated from the substrate 104 by the gate dielectric insulating layer 118. Overlap of the dc gate electrode 112 with respect to the clocked gate electrode 114 occurs in the region 134 for the dimension indicated at 144. A similar overlap of the clocked gate electrode 110 by the preceding cell dc gate 132 is also shown in FIG. 1. The electrical leads which connect the three gates 110, 112, and 114 to external sources of electrical potential $d_A$, $d_{DC}$, and $d_A$, are shown at 124, 126 and 128, respectively.

Below the gap 130 which separates the clocked gate 110 and the dc gate 112 in FIG. 1 is located a virtual gate region 116 which resides in the epitaxial layer portion 106 of the substrate 104. As shown in FIG. 1, the virtual gate region 116 extends downward into the indicated buried channel region of the FIG. 1 device. A charge layer 136 which resides below the virtual gate region 116 and forms a virtual barrier region is also shown in FIG. 1. As explained in greater detail below, this charge layer 136 results from an ion implanting operation performed during fabrication of the FIG. 1 array. Additional ion implanted charge layers located under the clocked and dc gates 110, 112, and 114 are indicated at 137, 138 and 139 in FIG. 1; extension of these charge layers under the trailing edge portion of the gates 110 and 114 is indicated in FIG. 1, along with the absence of such charge under the leading edge portions of these gates, as is indicated at 140 and 142. The charge absent regions 140 and 142 comprise clock barrier regions of the FIG. 1 CCD array, as is described in connection with the functional operation description of the FIG. 1 array subsequently herein.

The FIG. 1 type of CCD array may be embodied as either an N-channel or a P-channel device, as is known in the semiconductor art. As shown in FIG. 1, the CCD array is arranged as an N-channel device, and employs signals in the form of electron or negative charges as is indicated at 210, 211, 256, 258 and 260 in FIG. 2. Silicon is the preferred material of fabrication for the FIG. 1 array, including electrically conductive polysilicon for the gate electrodes 110, 112, and 114, with the fixed potential or dc gate 112 also being alternately fabricated from metal, as is described below. Fabrication materials other than silicon, including gallium arsenide and germanium are within contemplation of the invention and may, of course, involve the use of positive charges or holes as signal carriers.

Figure 2:
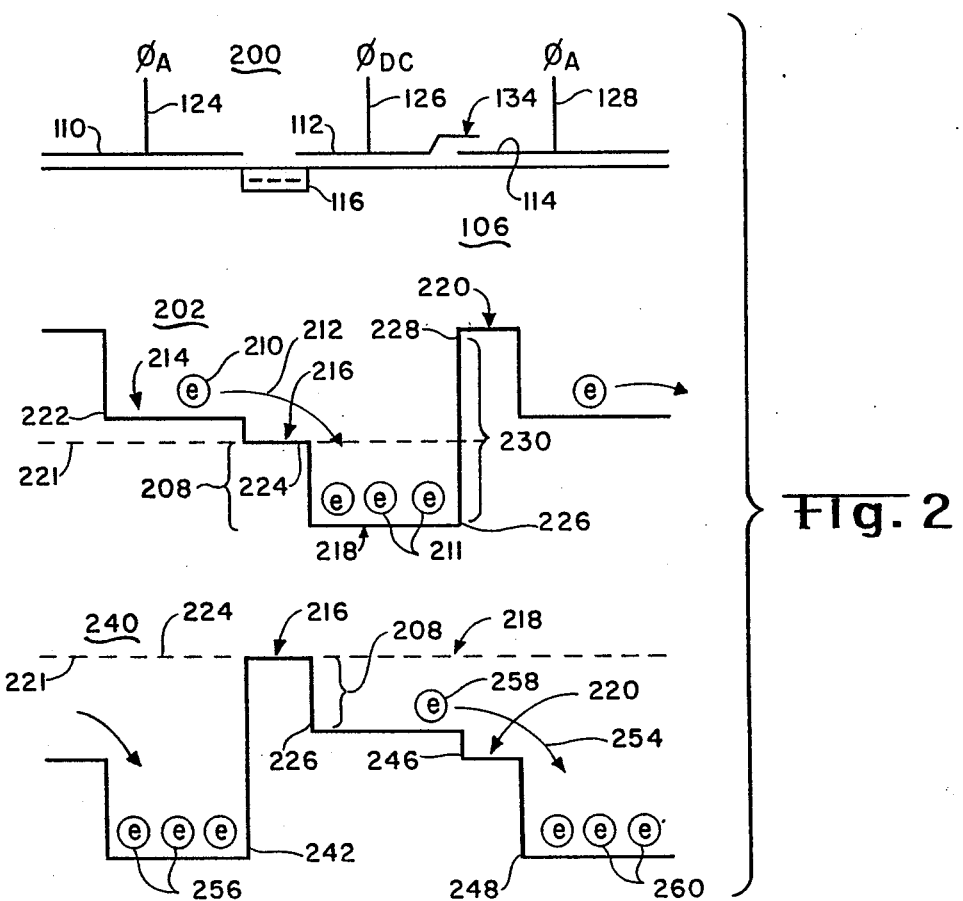
FIG. 2 shows the charge flow resulting from manipulation of the CCD gate electrode electrical potentials.

FIG. 2 in the drawings describes the preferred operating arrangements for a pseudo uniphase charge coupled device array of the FIG. 1 type; this description includes a diagrammatic representation of the FIG. 1 array at 200, a charge flow diagram for one condition of the clocked gates 110 and 114 at 202, and a charge flow diagram for the opposite or alternate condition of the clocked gates 110 and 114 at 240 in FIG. 2. In the CCD array representation at 200 in FIG. 2, identification of the gate electrodes 110, 112 and 114 corresponds to the identification of these elements in FIG. 1, as does identification of the leads 124, 126 and 128, the overlap region 134, and the virtual gate region 116. Repetition of these elements with the previously used identification number in FIG. 2 enables numbering consistency and enables convenient FIG. 1 and FIG. 2 relation of charge flows and other phenomena associated with the array.

The charge flow diagram at 202 in FIG. 2 shows four different levels of electric potential which act to control an element of electric charge such as the electrons indicated at 210. The four levels of electric potential in the diagram 202 are indicated at 222, 224, 226, and 228, while the geometric regions maintained at these relative potential levels are indicated at 214, 216, 218 and 220 in FIG. 2; these regions are vertically aligned with relevant parts of the CCD array as these parts are represented in the diagram at 200 in FIG. 2.

The charge flow diagram at 202 in FIG. 2 represents conditions wherein electron charge carriers 211 can flow over the virtual gate barrier geometric region 216—from the well of the geometric region 214 associated with the clocked gate electrode 110, to the entrapping well of the geometric region 218 associated with the fixed potential or dc gate 112. This flow, represented at 212 in the diagram at 202 in FIG. 2, occurs in response to an electric potential applied to the clocked gate 110 such that the well of the geometric region 218 is made more attractive to the electron charge carriers 211 than is the well of the region 214. In actuality, of course, this greater attraction for electron charge carriers results from the well of the region 218 being more positive in electrical potential than is the well 214. For electron charge carriers as shown at 211 in FIG. 2, the levels 222, 224, 226 and 228 therefore may be regarded as some representation of relative attraction other than absolute potential value, since higher potential values are normally represented as higher elevations in a diagram. The relative elevations of the levels 222-228 shown in FIG. 2 would, of course, be appropriate potential representatives for charge carriers of the positive polarity or hole type.

One notable aspect of the flow diagram 202 in FIG. 2 concerns the ability of region 218 to trap the indicated charge carriers by way of potential differences or well walls 230 and 208 which result from electric potential for the clock gate 114 and the ion implant regions described in connection with FIG. 1 and also in connection with FIG. 3 herein. Elevation of the region 214 above the barrier of the region 216 is a particularly notable aspect of the arrangement in the diagram 202, as is the well wall 230 which results from the implant conditions at 139 and 142 in FIG. 1. It is also notable that the height of the well wall 208 remains fixed despite the change of clock electrode potentials occurring between the diagrams at 202 and 240 in FIG. 2. The dotted line 221 in fact indicates the fixed reference nature of the level 224 between the diagrams 202 and 240. The potential wall height 208 is the result of the fixed potential applied to the gate 112, the virtual barrier charge layer 136 and connection of the virtual gate 116 ion implant region to the substrate 104. This connection of the virtual barrier charge layer 136 is accomplished by way of a channel stop region which is located below the plane of the FIG. 1 cross section in the substrate 104 but not shown in FIG. 1 or FIG. 2 of the drawings.

Connection of the virtual gate to the substrate 104 via the channel stop region enables use of charge "pinning" phenomena in the array of FIGS. 1 and 2. By way of such "pinning" in the present invention is achieved an improvement such that an electrically controllable gate is not required.

The ability to retain a collection of charge such as the electrons 211 within selected well regions is the sought-after mechanism in a CCD cell; this collection of electrons, comprising a sample of CCD array processed information, is the result of signal information, e.g., electrons, introduced electrically into the CCD array or alternately the result of photon energy reception in the substrate 104 and the resulting creation of hole-electron pairs in the FIG.1 and FIG. 2 CCD.

The controlled collection and shifting of electron charge carriers is further illustrated by the charge flow diagram 240 in FIG. 2 wherein electric potential applied to the clocked gates 110 and 114 has been changed to the values 242 and 248, that is, to values more attractive to the electron charge carriers than is the potential level 226 which resides under and results from the fixed potential dc gate electrode 112. With respect to the electron charge carriers represented in the FIG. 2 diagrams, the clock gates 110 and 114 are, in the diagram 240, more positive in potential than in the diagram 202 and are also more positive than the potential applied to the dc gate 112. As in the diagram 202, this more positive potential is represented in the diagram 240 by a deeper well and the electrons trapped by this deeper well are illustrated at 256. The well level 242 in the diagram 240 is also below that of the geometric region of the virtual gate barrier 216, while the well of the geometric region 218 in FIG. 2 has been elevated above the potential level 246 resulting from the clocked barrier regions 140 and 142 in FIG. 1. By way of these relative levels, the flow of electrons indicated at 254 into the next adjacent trapping well, as indicated at 260 in the diagram 240 occurs.

The operating potentials selected for the dc gate 112 and the clocked gates 110 and 114 are relatively uncritical in the present invention, and may therefore be selected over a relatively large band to provide the effects illustrated in the diagrams 202 and 240 in FIG. 2. Selection of operating gate potentials is, of course, also dependent upon the doping levels and barrier heights at—140, 136, and 138 in FIG. 1—attained during the ion implantation attending the areas 138, 140, 116, 136, 137, and 142 in FIG. 1. The electrical characteristics of several regions in the substrate 104 as shown in FIGS. 8–11 of the drawings are actually determinative of the employed operating gate potentials as is explained below.

Figure 3:
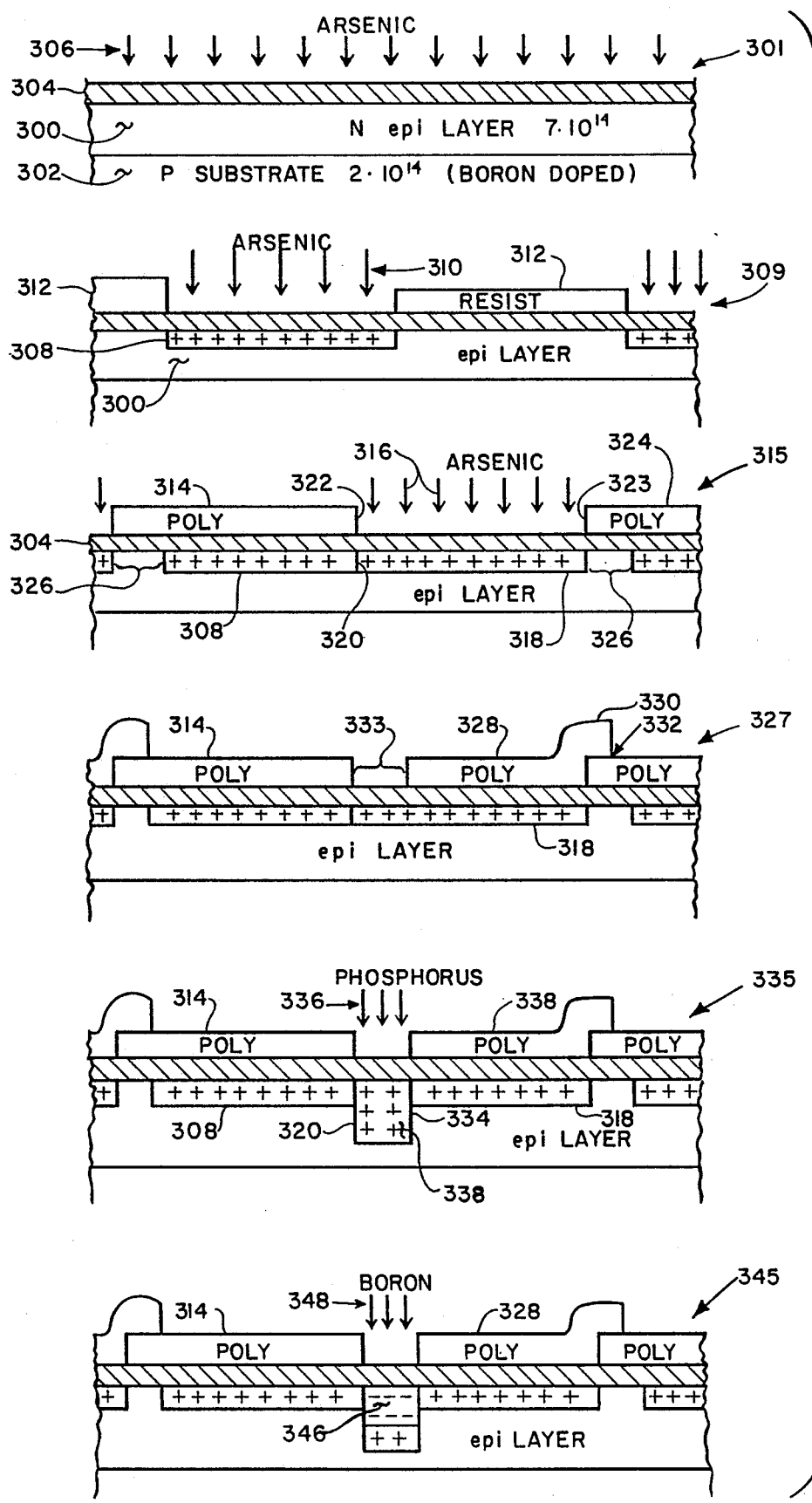
FIG. 3 shows a possible fabrication sequence usable to attain CCD arrays in accordance with the invention.

FIG. 3 in the drawings shows one possible sequence for fabricating a charge coupled device of the FIG. 1 type. In FIG. 3, some of the more significant fabrication steps are represented, and additional steps are implied or shown by results. The terms implanting and impregnating are used interchangeably with respect to the FIG. 3 steps and otherwise in the present document. The fabrication steps of FIG. 3 are additionally described by the information of FIGS. 5–11. The FIGS. 5–11 information, however, relates to a particular type of CCD, a deep channel, fringe effect, peristaltic action CCD—a CCD which differs in fabrication from the more conventional shallow channel CCD.

In the step represented at 301 in FIG. 3, a P-substrate 302 is provided with an N layer region 300 by way of ion implantation of a material such as phosphorous, as is indicated by the flux at 306. The ion implant in step 301 in FIG. 3 is shown to be accomplished through the gate dielectric oxide insulating layer 304, as is a common practice in the integrated circuit fabrication art. In an alternate arrangement of the invention, the implantation represented at 301 in FIG. 3 may be replaced by starting the fabrication sequence with a P-substrate material which is overlaid with an N arsenic doped epitaxial layer; semiconductor wafers of this nature are readily available from commercial suppliers of integrated circuit components. Boron doping of a concentration near 2E14 ($2 \times 10^{14}$ atoms per cubic centimeter) is desired for the P-substrate 302 and arsenic concentration in the range of 7E14 is appropriate for the N layer 300. The layer 300 is also preferably near 3.0 micrometers in thickness.

Figure 5:
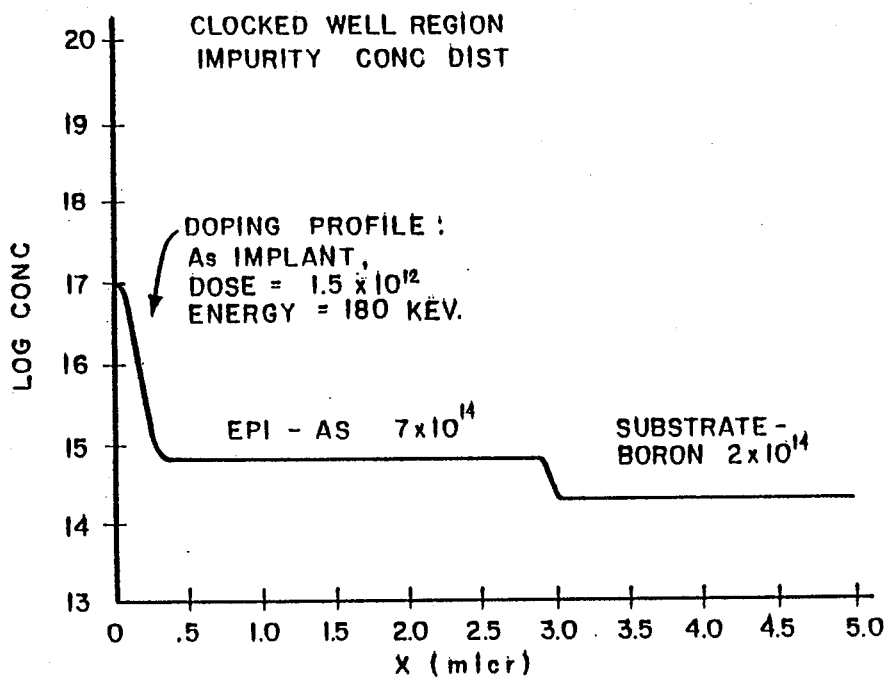
FIG. 5 shows a possible impurity concentration distribution diagram for clocked well regions of the described CCD array.

Arsenic ion implantating to form the charge layer 138 in FIG. 1 is represented in the step of 309 in FIG. 3, the arsenic implant flux being designated at 310 in FIG. 3. The N region resulting from the implant 310 is shown at 308 in FIG. 3, and preferably has an impurity concentration in the range of 1E17 near the surface of the epitaxial layer, with this concentration decreasing over a depth of 0.4 micron to a doping concentration of 7E14 in the epitaxial layer 300, as is shown by the impurity concentration distribution diagram of FIG. 5 in the drawings. An implant dose in the range of 1.5E12 and an energy level of 180 K electron volts (180 KEV) is appropriate for the implant 310 as is also indicated in FIG. 5. FIG. 5 also indicates the desired 2E14 boron impurity concentration in the substrate 302 in FIG. 3. The physical extent of the implant 310 in the epitaxial layer is determined by the resist material mask 312 which is applied over the insulating layer 304 in a manner known in the art.

In the step 315 in FIG. 3, arsenic implant flux represented at 316 and forming the N-implanted impurity region 318 is shown. The region 318 corresponds to the ion-implanted charge layer 137 in FIG. 1. Prior to the implantation shown at 315 in FIG. 3, gate electrodes 314 and 324, which are fabricated of conductive polysilicon material, are formed using known resist masking and polysilicon deposition techniques. It should be noted that the gate electrodes 314 and 324 extend over regions 326 which were shielded from the implant flux 310 by the resist 312 in the step 309 implant. The regions 326 correspond to the region 140 and 142, the clocked barrier regions, identified above in FIG. 1. The impurity concentrations in the regions 326 are essentially those of the layer 300 formed in the step of FIG. 3. A line of demarcation 320 between the implant provided by the flux 310 and the implant by the flux 316 is indicated in the step 315, however, in reality no physical demarcation exists, since the flux 316 implant is preferably accomplished in a manner identical to the flux 310 implant and the impurity region 318 and the implant layer 308 are of the same nature. The physical extent of the implant from the flux 316 is determined by the boundaries 322 and 323 of the adjacent polysilicon gate electrodes 314 and 324, according to the self-aligning mask techniques known in the integrated circuit art.

In the step 327 in FIG. 3, an additional polysilicon gate electrode 328 is formed over a portion of the N-implanted impurity region 318, this polysilicon gate corresponds to the fixed potential or dc gate electrode 112 in FIG. 1 and overlaps the next following clocked gate electrode in the region 330. The gate electrodes 328 and 327 are electrically insulated from each other in the region 332 by an oxidized polysilicon layer as was indicated at 122 in FIG. 1. A gap region 333 is provided between the polysilicon gates 328 and 314 as is also indicated in the step 327 of FIG. 3. This gap overlies the virtual barrier, virtual gate regions 116 and 136 which were described above in connection with FIG. 1.

Figure 6:
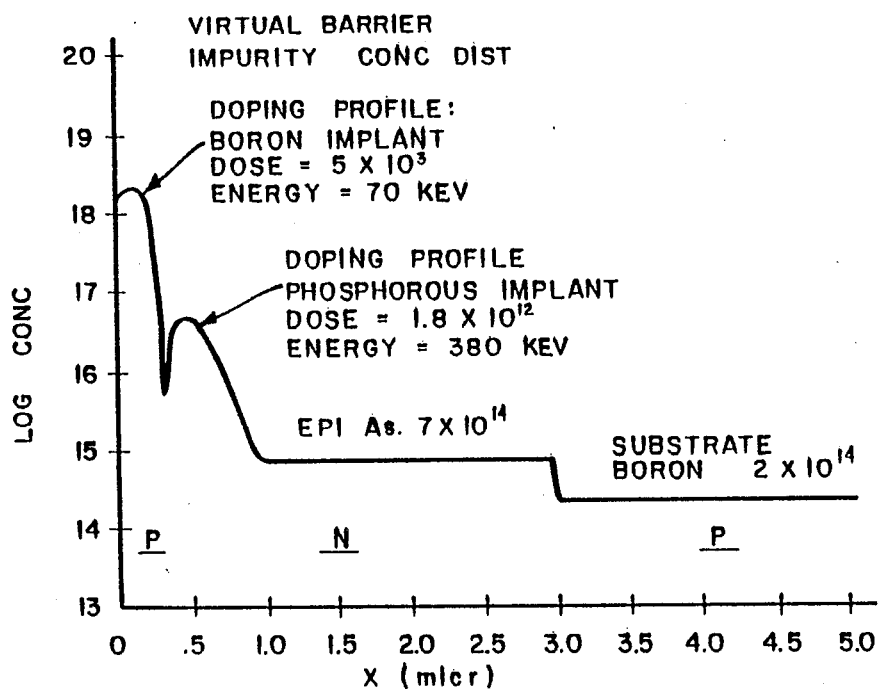
FIG. 6 shows a possible impurity concentration distribution diagram for virtual barrier regions of the described CCD array.

A deep high-energy phosphorous ion implantation by the flux 336 is shown in the step 335 of FIG. 3; the flux 336 implant results in an impurity region 338 which corresponds to the virtual barrier charge layer 136 in FIG. 1. This phosphorous implant must be deep enough to avoid counter doping by the succeeding boron doping. The high energy of the phosphorous implant requires use of thick photoresist layer and thick polysilicon layer masks. The phosphorous impurity region 138 is shown in FIG. 6 of the drawings to have a maximum impurity concentration in the range of 1E16 atoms per cubic centimeter, a concentration attained with the indicated phosphorus implant dosage of 1.8E12 and an energy level of 380 K electron volts. The lateral extent of the implant from the flux 336, that is, location of the demarcation lines 320 and 334 in FIG. 3 is also determined by edges of the polysilicon gate electrodes 314 and 328 according to the known self-aligning mask arrangement. The self-aligned implant is preferred in order to reduce overlap capacitance of the clocked and virtual gates and to eliminate the temperature cycling necessary in doping and oxidizing the polysilicon gates. A possible complicating side effect from this high-energy phosphorous implant is discussed below.

A second implantation using the self-aligning masking characteristics of the gate electrodes 314 and 328 is represented in the steps shown at 345 in FIG. 3. This second implanting, by the flux indicated at 348, results in the charge region 346 with the implanted ions being of boron material and thereby generating a P-region—as is indicated by the negative signs in the region 346. An impurity concentration in the range of 1E18 and achieved by a dosage of 5E13 and an energy level of 70 KEV is preferred for the implant of the flux 348.

Generally, the sequence indicated in the steps 335 and 345, that is, first implanting with phosphorus and then implanting with boron, is desirable for the virtual gate, virtual barrier regions of the CCD array. This sequence is desirable in view of the implanting characteristics of phosphorus and boron and the tendency of the boron material to diffuse at a faster rate than does the phosphorus material—that is, the boron implanting is preferably accomplished last in order to minimize diffusing by the implanted boron. The boron implant, however, is preferably followed by a rapid thermal annealing, at, for example, 1100° C. for 10 seconds in order to activate the dopant atoms. The implanted region 346 principally serves as a highly-doped electrical conductor and as indicated above, is preferably connected to channel stopping elements and thence to the substrate of the CCD in order to control the potential at the virtual barrier impurity region 338. Presence of this electrically connected highly-doped high conductivity region 346 allows the characteristics of the CCD to be independent of the metallic or non-metallic materials used for fabricating the gates 314 and 328.

A CCD array made according to the sequence of steps indicated in FIG. 3 may be characterized as being a 20 micron device, that is, cells of the type shown in FIG. 3 may be located on 20 micron centers without undue processing difficulties. Smaller or larger characteristic dimensions are, of course, within contemplation of the invention, and may be used where the processing equipment is available and the development of such processes has been accomplished.

Figure 4:
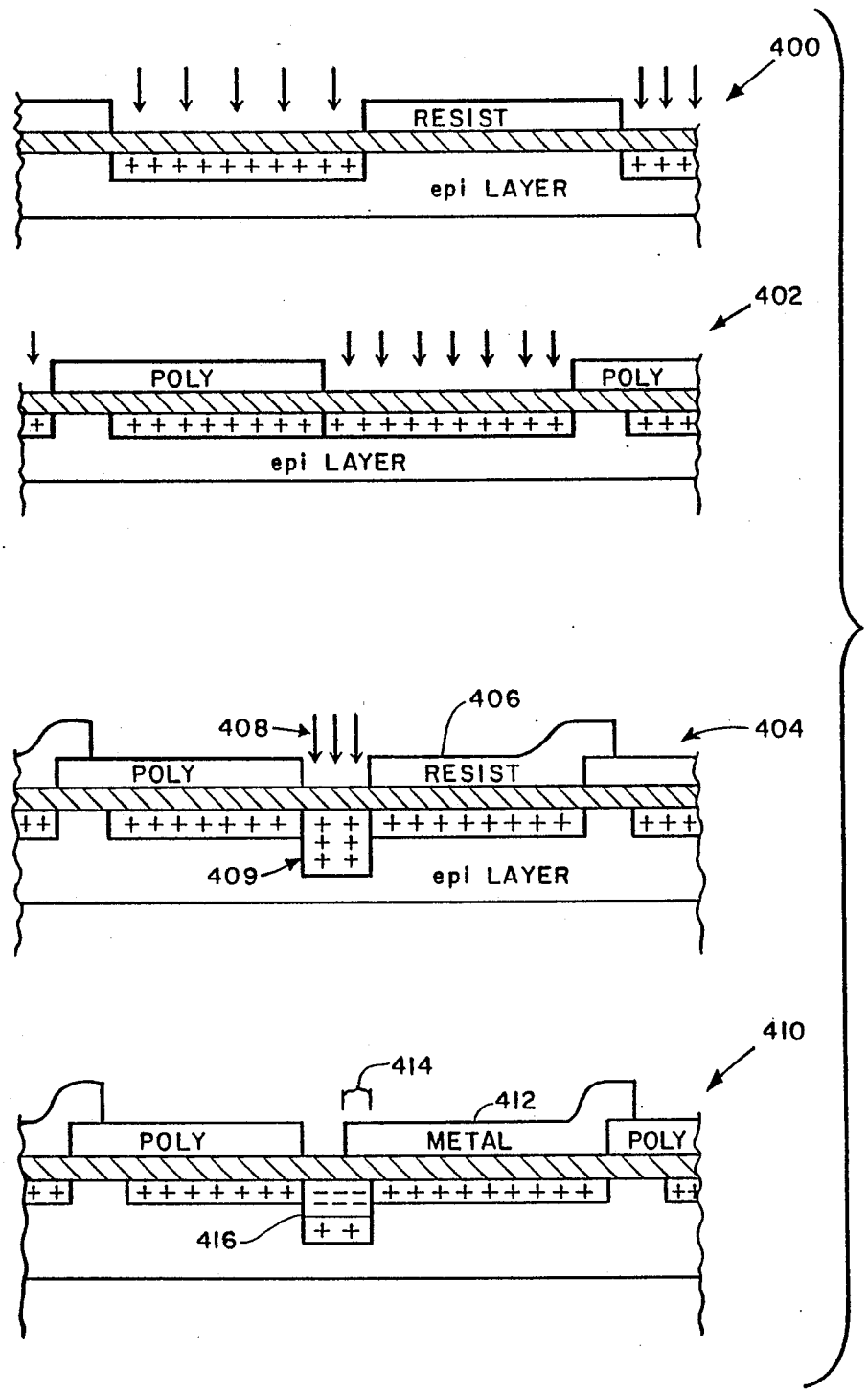
FIG. 4 shows a possible fabrication sequence for alternate arrangements of the invention.

A variation of the steps shown in FIG. 3 of the drawings is shown in FIG. 4 in the drawings. In this variation a sequence having preliminary steps 400 and 402 which are similar to the steps at 309 and 315 in FIG. 3 is shown. In the step 404 of FIG. 4, the polysilicon gate electrode, 328 in FIG. 3, is replaced with a coating of photoresist material 406 for performing an ion implantation by the flux 408. The flux 408 produces the N-region 409. The photoresist material 406 is also used for a second ion implantation of the type indicated at 348 in FIG. 3, but not shown in FIG. 4 in order to generate the virtual gate region 416 which is shown in the view 410 in FIG. 4. Subsequent to these implants, the photoresist material 406 is removed and replaced with a metal gate 412 in the FIG. 4 CCD. Preferably, the gate 412 is fabricated of deposited metallic aluminum.

CCDs employing metal gates as represented in FIG. 4 find usefulness in electrical signal processing applications where the optical shielding by a metallic gate electrode is not detrimental and can eliminate the added manufacturing necessary for a second polysilicon level. The optical energy transmitting characteristics of polysilicon gate electrodes 314 and 328 in FIG. 3 lend CCDs of this type the ability to receive, scan, and process signal information originating in the form of a visual scene. The light transmitting ability of the polysilicon gate electrodes 314 and 328 enables generation of hole-electron pairs in the CCD of FIG. 3, as was indicated in connection with the description of FIG. 1 above. The layer of passivating oxide material which is presumed applied above the polysilicon gates 314 and 328 and also above the gates of the FIG. 4 structure is capable of transmitting optical energy, as would be needed by a CCD transducer made according to the FIG. 3 structure.

The lateral extent of the gate 412 in FIG. 4 is shown to overlap by some small amount 414 the virtual gate and virtual barrier region at 416 in FIG. 4. The degree of this overlap is not critical to the CCD performance and indeed, the ability to accept this overlap and ability to use a metal gate in the FIG. 4 CCD is enabled by the highly conductive gate region 416 resulting from the heavy boron implanting of this region.

Figure 7:
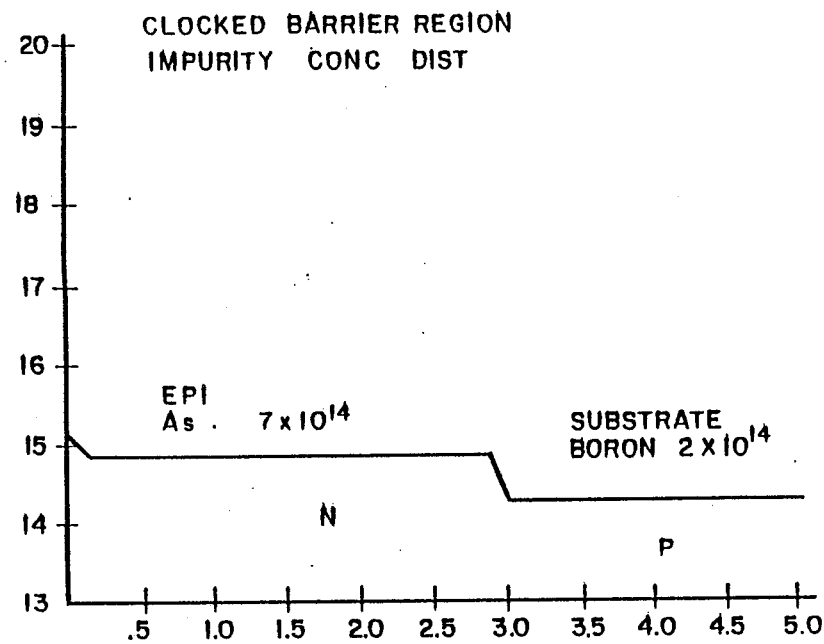
FIG. 7 shows a possible impurity concentration distribution diagram for clocked barrier regions of the described CCD array.

An impurity concentration distribution profile for a deep channel or peristaltic action CCD embodiment of the invention, a profile suitable for the clocked barrier regions 140 and 142 in FIG. 1 and 326 in FIG. 3 is shown in FIG. 7 of the drawings; the impurity concentrations indicated in FIG. 7 are similar to those recited earlier for the layer 300.

The electric potential curves shown in FIGS. 8–11 of the drawings are useful in assigning operating potentials and in further understanding the operation of the described CCD array; the FIGS. 8–11 potential curves and also the FIGS. 5–7 impurity concentration distribution curves are, of course, but typical of the arrangements which may be used in embodying the invention. Variations of these typical arrangements capable of achieving CCD array performance will be apparent to those skilled in the semiconductor device and related arts.

Figure 8:
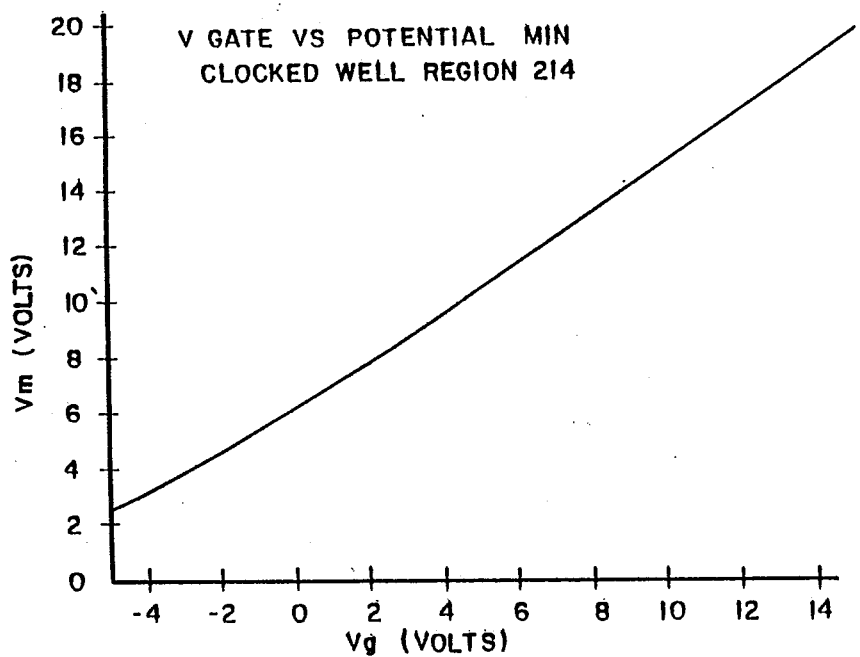
FIG. 8 shows desirable electrical potential characteristics in clocked well regions of the described array.

The FIGS. 8–11 potential curves describe variation of potentials in the CCD buried charge carrying channel 146 as the voltage applied to a respective identified gate electrode is varied. FIG. 8 shows a possible set of potential relationships for the clocked well regions underlying the charge layer 138 in FIG. 1, the region 214 in FIG. 2. As indicated in FIG. 8 an implanted charge layer potential of about five and one-half volts is achieved with a gate voltage of 0.9 volts along with charge channel potential variations of about 1 volt per volt of gate voltage change. A desirable operating voltage range for the clocked gate (as determined by the associated clocked well region potentials in FIG. 8) is 0 volts to +10 volts; such an operating voltage range will result in a potential variation of 5.5 volts to 14.5 volts with respect to the FIG. 2 and FIG. 8 diagrams.

The virtual barrier region of the buried channel, the region below the charge layer 136 in FIG. 1, is fixed at a potential of about 6 volts. As shown by the electric field relationships in FIG. 10, the virtual barrier region is below a critical breakdown condition.

Figure 9:
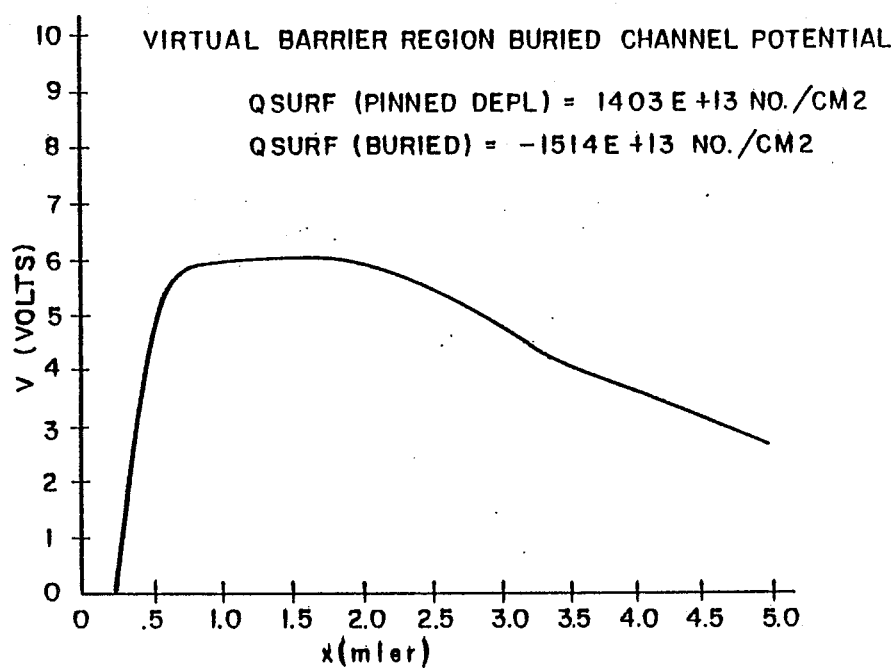
FIG. 9 shows desirable electrical potential characteristics in virtual barrier regions of the described CCD array.
Figure 10:
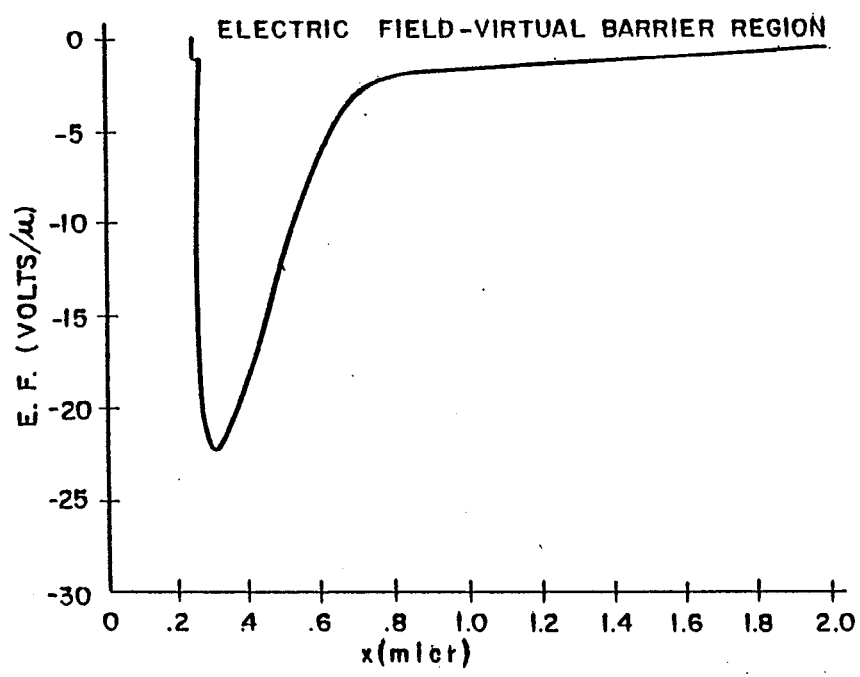
FIG. 10 shows variations in the electric field attending virtual barrier regions of the described CCD array.

A desirable operating voltage for the DC gate electrode 112 in FIG. 1 is determined by the desired effective barrier height which can be determined from FIG. 8 and FIG. 9 and in the presently described embodiment of the invention may be in the range of +4 volts.

Figure 11:
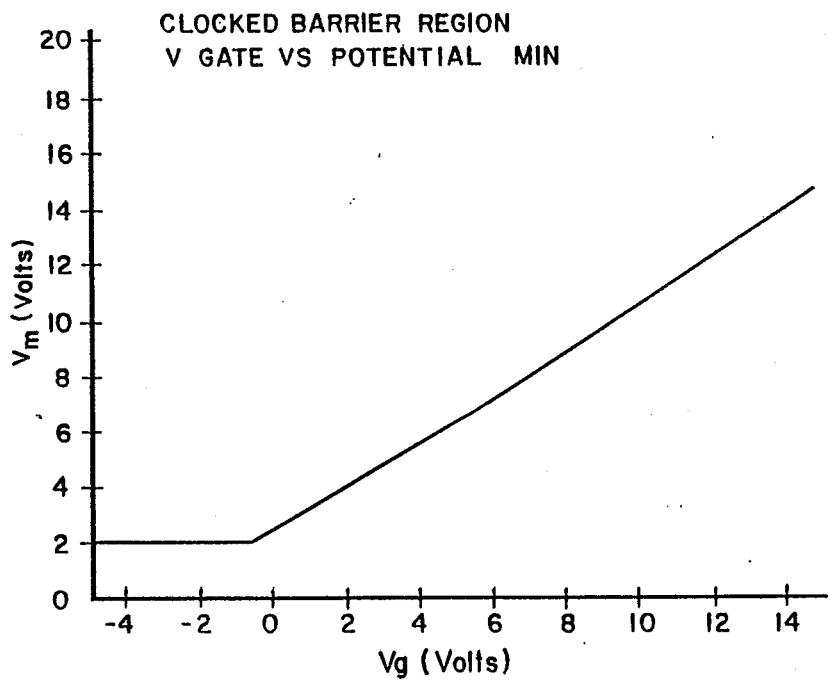
FIG. 11 shows desirable electrical potential characteristics in clocked barrier regions of the described array.

The curve in FIG. 11 shows the implant of the clocked barrier regions 140 and 142 to achieve a buried channel potential near two and one-half volts at a gate voltage of 0 volts and with gate control of this voltage including a sensitivity near 0.90 volt per volt of gate voltage being possible in the positive gate voltage direction. The absence of buried channel potential change as illustrated by the flat region of the FIG. 11 curve below −1 volt of gate voltage can be attributed to pinning due to pulling holes from the channel stop regions. These holes effectively shield the potential under the clocked barrier from changes in gate voltage. The clock gate electrode (110 and 114) voltages determined from FIG. 8 result in a potential variation of 2.5 volts to 11 volts as determined from FIG. 11.

In summary, therefore, clocked gate voltages of 0 volts to +10 volts and a DC gate voltage of +4 volts determine one possible operating mode of the FIGS. 1-4 described CCD array. Other operating voltage ranges for the described embodiment of the invention could be arranged; other embodiments of the invention and attendant different operating voltages are also feasible.

The 380 KEV phosphorous implant performed by the flux 336 in FIG. 3 and the flux 408 in FIG. 4 of the drawings and indicated in FIG. 6 of the drawings, if accomplished in a manner allowing ion penetration of the polysilicon gates, may under some conditions result in a fixed charge layer occurring in the gate dielectric of the CCD array. Such charge layer can shift the operating voltage of the described device out of the usable operatable range. An implant arrangement which avoids charge layers associated with the polysilicon gate structures such as resist masking of the polysilicon gates is therefore to be preferred in fabricating the described embodiment of the invention.

The absence of need for a virtual well wall region as employed, for example, in the CCD device of U.S. Pat. No. 4,229,752 is a notable advantage of the present invention. The three ion implants and high impurity concentrations in a relatively small region of the CCD substrate as are usually employed in achieving such virtual wall regions are avoided in the present invention arrangement; such avoidance desirably eliminates difficulties with electrical breakdown and manufacturing techniques.

The present invention CCD array is notable therefore in allowing desirable flexibility in setting operating voltages, requires only a simple single-phase clock signal, adapts well to either electrically embodied or optically embodied signal information, avoids undesirable narrow element spacings and multiple overlapping of gate electrodes, requires minimal special processing or manufacturing steps and is capable of good production yields. Other advantages of the present invention CCD array invention include the self-aligned features evident in the process sequences of FIG. 3 and FIG. 4.

While the apparatus and method herein described constitute a preferred embodiment of the invention, it is to be understood that the invention is not limited to this precise form of apparatus or method, and that changes may be made therein without departing from the scope of the invention, which is defined in the appended claims.

I claim:

1. A method for fabricating a pseudo uniphase charge coupled device cell comprising the steps of:
   forming a gate insulating oxide film layer over the doped surface layer charge flowpath of a single crystal semiconductor substrate member;
   implanting areas of said oxide layer covered substrate member along said flowpath predetermined as clock well loci with impurity ions of predetermined quantity, energy level and type, the non-clock well areas of said substrate being shielded from ion implant by a removable shielding pattern of photo responsive resistive material;
   covering said implanted clock well loci and an additional non-charged barrier area immediately preceding each said clock well locus along said flowpath in said substrate with first conductive areas of polysilicon gate material;
   embedding the substrate regions intermediate said polysilicon gate material regions along said flowpath with a second dose of impurity ions of predetermined type, quantity and energy level;
   said polysilicon gate material areas determining, as self-aligning masks, the substrate region subjected to said embedding;
   depositing second areas of conductive gate material in the flowpath regions intermediate said polysilicon gate material areas, said deposited second area gate material extending from a flowpath point spaced a predetermined distance apart from the trailing edge of each preceding polysilicon gate material area to a region of electrically insulated overlap substantially covering said gate charge barrier area of the next adjacent polysilicon gate material area along said flowpath;
   impregnating said predetermined distance apart substrate flowpath areas with a third dose of virtual barrier forming impurity ions of predetermined type, quantity and energy level, said preceding polysilicon gate material area together with said second area of conductive gate material determining, as self-aligning masks, the substrate region extent of said impregnating predetermined type impurity ions in each spaced apart flowpath area; and
   instilling said predetermined spaced apart substrate flowpath areas with a fourth dose of virtual gate forming impurity ions of predetermined type, quantity and energy level, and electrical polarity opposite of said impregnating impurity ions, said preceding polysilicon gate material area together with said second area of conductive gate material also determining, as self-aligning masks, the substrate region extent of said instilled impurity ions in each spaced apart flowpath area.

2. The method of claim 1 further included the step of ion implanting an upper layer of said substrate member to form said doped surface layer.

3. The method of claim 1 wherein said charge coupled device cell is an N-channel device and wherein said implanting of clock well loci comprises a phosphorous ion implant.

4. The method of claim 1 further including the step of oxidizing the surface of said polysilicon gate material prior to said depositing step.

5. The method of claim 1 wherein said conductive gate material is polysilicon.

6. The method of claim 1 wherein said conductive gate material is metallic aluminum.

7. The method of claim 3 wherein said virtual barrier forming impurity ions are also phosphorous ions.

8. The method of claim 7 wherein said predetermined energy level of said impregnating step is greater than the energy level of any one of said implanting, said embedding and said instilling steps.

9. The method of claim 7 wherein said impurity ions of said instilling step comprise boron ions.

10. The method of claim 9 further including the step of annealing and thereby activating said boron ions following said instilling step.

11. The method of claim 10 wherein the impurity concentration of said boron from said instilling step is greater than the impurity concentration of any one of said impregnating, said implanting, and said embedding steps.

12. The method of claim 11 wherein said semiconductor substrate material is doped with boron P impurity of concentration 2E14 and said doped surface layer is doped with arsenic of concentration 7E14 and has a thickness of three micrometers.

13. The method of claim 12 wherein said implanted impurity ions are arsenic N impurity ions of concentration between 1E17 and 7E14 over the depth of four tenths micron into said surface layer charge flowpath and wherein said implanting step includes a dose of 1.5E12 and an energy level of one hundred eighty kilo electron volts.

14. The method of claim 13 wherein said embedding step comprises ion implanting with an N impurity, said impregnating step comprises a high energy phosphorous ion implantation of impurity concentration 1E16 using a dose of 1.8E12 and an energy level of three hundred eighty kilo electron volts, and said instilling step comprises ion implanting with a boron ion implantation of impurity concentration 1E18 using a dose of 5E13 and an energy level of seventy kilo electron volts.

15. The method of claim 11 wherein said implanting ion resistive material of said depositing step is polysilicon material comprising a second conductive polysilicon gate.

16. A method for fabricating a pseudo uniphase charge coupled device cell comprising the steps of:
   forming a gate insulating oxide film layer over the doped surface layer charge flowpath of a single crystal semiconductor substrate member;
   implanting areas of said oxide layer covered substrate member along said flowpath predetermined as clock well loci with impurity ions of predetermined quantity, energy level and type, the non-clock well areas of said substrate being shielded from ion implant by a removable shielding pattern of photo responsive resistive material;
   covering said implanted clock well loci and an additional non-charged barrier area immediately preceding each said clock well locus along said flowpath in said substrate with conductive areas of polysilicon gate material;

embedding the substrate regions intermediate said polysilicon gate material regions along said flowpath with a second dose of implanted impurity ions of predetermined type, quantity and energy level;

said polysilicon gate material areas determining, as self-aligning masks, the substrate region subjected to said embedding implant;

depositing implanting ion resistive material into the flowpath regions intermediate said polysilicon gate material areas, said deposited material extending from a flowpath point spaced a predetermined distance apart from the trailing edge of the preceding polysilicon gate material area to a region of electrically insulated overlap substantially covering of the leading edge portion of the next adjacent polysilicon gate material area along said flowpath;

impregnating said predetermined distance apart substrate flowpath areas with a third dose of virtual barrier forming impurity ions of predetermined type, quantity and energy level, said preceding polysilicon gate material area together with said implanting ion resistive material determining, as masks, the substrate region extent of said impregnating predetermined type impurity ions in each distance apart flowpath area; and instilling said distance apart substrate flowpath areas with a fourth dose of virtual gate forming impurity ions of predetermined type, quantity and energy level, and electrical polarity opposite of said impregnating impurity ions, said preceding polysilicon gate material area together with said implanting ion resistive material also determining, as masks, the substrate region extent of said instilling impurity ions in each distance apart flowpath area.

17. The method of claim 16 wherein said charge coupled device cell is an N-channel device and wherein said implanting of clock well loci comprises a phosphorous ion implant.

18. The method of claim 16 wherein said implanting ion resistive material of said depositing step is photosensitive resist material and further including the steps of removing said resist materials and depositing in the removed material area, a metallic gate electrode.

19. A method of charge coupled device cell fabrication comprising the steps of:

forming a plurality of ion implanted clock well loci in the doped surface layer charge flowpath of a semiconductor substrate member;

disposing conductive polysilicon gate electrodes over the combination of each clock well loci and a charge free barrier area preceding each said clock well loci;

embedding the flowpath region intermediate said gate electrodes with second doses of implanted impurity ion of predetermined type, quantity and energy level;

depositing second areas of conductive gate material in the flowpath regions intermediate said polysilicon gate electrodes, said deposited second area gate material extending from a flowpath point predetermined spaced apart from the trailing edge of each preceding polysilicon gate electrode to a region of electrically insulated overlap substantially covering the charge free barrier area of the next adjacent polysilicon gate along said flowpath;

impregnating said predetermined spaced apart substrate flowpath areas with a third dose of virtual barrier forming impurity ions of predetermined type, quantity and energy level, said predetermined polysilicon gate together with said second area of conductive gate material determining, as self-aligning masks, the substrate region extent of said impregnating impurity ions in each spaced apart flowpath area; and instilling said predetermined spaced apart substrate flowpath areas with a fourth dose of virtual gate forming impurity ions of predetermined type, quantity and energy level, and electrical polarity opposite of said impregnated ions, said preceding polysilicon gate together with said second area of conductive gate material also determining, as self-aligning masks, the substrate region extent of said instilled impurity ions in each spaced apart flowpath area.

* * * * *